(12) United States Patent
Isnardi et al.

(10) Patent No.: US 8,438,450 B2
(45) Date of Patent: May 7, 2013

(54) METHOD AND SYSTEM FOR PERFORMING DATA INTEGRITY VERIFICATION OF A TRANSPORT STREAM

(75) Inventors: Michael Anthony Isnardi, Plainsboro, NJ (US); Arkady Kopansky, Havertown, PA (US); Yanjun Xu, Princeton, NJ (US); Ali Chaudhry, Robbinsville, NJ (US)

(73) Assignee: SRI International, Menlo Park, CA (US)

( * ) Notice: Subject to any disclaimer, the term of this patent is extended or adjusted under 35 U.S.C. 154(b) by 521 days.

(21) Appl. No.: 12/695,533

(22) Filed: Jan. 28, 2010

(65) Prior Publication Data

US 2010/0199159 A1    Aug. 5, 2010

Related U.S. Application Data

(60) Provisional application No. 61/148,497, filed on Jan. 30, 2009.

(51) Int. Cl.
*H03M 13/00*    (2006.01)
(52) U.S. Cl.
USPC ........................................................ 714/758
(58) Field of Classification Search .................. 714/758, 714/708, 776, 784, 761, 762
See application file for complete search history.

(56) References Cited

U.S. PATENT DOCUMENTS

| | | | |
|---|---|---|---|
| 7,652,999 B2* | 1/2010 | Liu et al. | 370/241 |
| 7,657,913 B2* | 2/2010 | Pedlow, Jr. | 725/95 |
| 8,166,355 B2* | 4/2012 | Jashek et al. | 714/708 |
| 2006/0274737 A1* | 12/2006 | Liu et al. | 370/389 |
| 2008/0189546 A1 | 8/2008 | Yoon | |

OTHER PUBLICATIONS

Mary-Luc Champel, "IMAGES project WP7: Securing Transport of Video Feeds Over IP," 2007, http://www.celtic-initiative.org/Events/Past-Events/Celtic-Event07-Berlin/Presentations/B2_2_IMAGES_PART2_Champel.pdf, (Lasted visited Jun. 23, 2010).

* cited by examiner

*Primary Examiner* — Fritz Alphonse
(74) *Attorney, Agent, or Firm* — Moser Taboada (57) ABSTRACT

A method, system, and computer-readable medium for facilitating integrity verification of a transport stream is provided. Integrity verification is performed without increasing the bit rate of the transport stream by generating a checksum corresponding to a portion of the transport stream and inserting the checksum into a null packet within the transport stream. Utilizing a null packet to carry the checksum allows the checksum to be transmitted without increasing the bit rate of the transport stream. In addition, by creating a checksum corresponding to a portion of the transport stream, integrity verification may be performed on a streaming data file.

15 Claims, 8 Drawing Sheets

Figure 8 ated result. When such errors occur in a military, surveillance, or entertainment setting, the effect may significantly diminish the value of the data file.
METHOD AND SYSTEM FOR PERFORMING DATA INTEGRITY VERIFICATION OF A TRANSPORT STREAM

CROSS-REFERENCE TO RELATED APPLICATION

This application claims the benefit of U.S. Provisional Patent Application No. 61/148,497, filed Jan. 30, 2009 titled, "Detecting Modification of MPEG-2 Transport Streams Without the Addition of Redundant Data," which is herein incorporated by reference.

GOVERNMENT INTEREST

The invention described herein has been manufactured, used and licensed by or for the U.S. Government under contract number DAAB07-01-D-G601.

FIELD OF THE INVENTION

The present invention relates generally to data integrity verification. More specifically, embodiments of the present invention relate to a method and system for detecting errors within a transport stream without increasing the bit rate of the transport stream.

BACKGROUND OF THE INVENTION

Errors or modifications (herein referred to collectively as an "error") may be introduced into a transport stream during transmission. Such errors could result in rendering a data file that does not accurately represent the intended result. When such errors occur in a military, surveillance, or entertainment setting, the effect may significantly diminish the value of the data file.

As a result, error detection tools, such as checksums, are commonly used to verify the integrity of a data file. Integrity verification refers to the process of confirming whether one or more errors have been introduced into a data file during transmission. Conventional data integrity verification processes rely on checksums to verify the integrity of an entire data file and determine if an error is present within the entire data file. For example, when verifying the integrity of a plurality of packets representing a picture file, a receiving node must wait until each of the plurality of packets has arrived. This method of integrity verification is ineffective for a streaming data file wherein a portion of the data file is rendered before all packets related to the data file have arrived at a receiving node.

Addressing this issue has been problematic because any modification to a streaming data file to facilitate integrity verification must be backwards compatible to ensure that new network nodes, as well as legacy network nodes, can handle any such modification without causing malfunctions within legacy nodes.

Furthermore, increasing the bandwidth of a transport stream is always a concern when implementing an error detection process. Conventional methods of performing error detection often add additional bytes to a transport stream, wherein the bytes are used solely for error detection or correction. The addition of such bytes increases the bandwidth of the transport stream and reduces the efficiency of the transport stream. For example, a typical forward error correction algorithm may increase the bandwidth of a transport stream by 10-40%. In instances where bandwidth is limited, the additional bandwidth could have a significant effect on the transmission of a transport stream.

As a result, there is a need in the art for a method, system, and computer-readable medium for facilitating integrity verification of a transport stream comprising a streaming data file that can be received by both new and legacy network nodes, while at the same time not increasing the bandwidth of the transport stream.

SUMMARY OF THE INVENTION

Embodiments of the present invention satisfy these needs and others by providing a method, system and computer-readable medium configured to insert a checksum into a null packet within a transport stream wherein the checksum may be used to verify the integrity of a portion of the transport stream. The term "null packet" is intended to include, but is not limited to, a packet that does not carry data utilized when decoding the elements of a transport stream. A null packet is often used when encoding a constant bit rate transport stream to maintain the required constant bit rate. The term "checksum" is intended to include, but is not limited to, a datum that corresponds to a given group of packets wherein the datum may be used to determine if an error is present or change has occurred within the corresponding group of packets.

According to an embodiment of the present invention, a transport stream may represent a streaming data file encoded at a constant bit rate. In order to maintain a constant bit rate when encoding the streaming data file, the transport stream may contain one or more null packets. Embodiments of the present invention utilize one or more of the null packets to carry checksums associated with the transport stream. Advantageously, by inserting the checksums in null packets, the total bandwidth of the transport stream remains unchanged, despite the fact that one or more checksums have been inserted into the transport stream.

Furthermore, embodiments of the present invention allow for the integrity of a portion of the transport stream to be verified. According to certain embodiments of the present invention, a plurality of packets within the transport stream are grouped into a datagram. The term "datagram" is intended to include, but is not limited to, a sequence of contiguous packets within a transport stream that does not contain a null packet. A datagram is created by grouping the sequence of packets, wherein the grouped packets may be addressed as a single unit of data without making any changes to the data within each of the plurality of packets. The packets are grouped by appending the bytes of a first packet with the bytes of a second packet, and so for the entire set of packets being grouped into the datagram. For example, a datagram based on five packets, wherein each packet has a fix length of 188 bytes, will be represented by a 940 byte datagram comprising the five packets.

Following the creation of a datagram, an embodiment of the present invention generates a checksum corresponding to the datagram. The datagram may be utilized by a receiving node to determine if an error is present within the corresponding datagram. Given that the checksums correspond with datagram within the transport stream, the receiving node need only receive the entire datagram to conduct integrity verification, as opposed to an entire data file. Therefore, embodiments of the present invention may be used to perform integrity verification on streaming data files.

An embodiment of the present invention provides for a method of inserting a checksum into a transport stream wherein the transport stream includes a plurality of null packets and a plurality of non-null packets, the method comprising the steps of grouping the plurality of non-null packets into a datagram, generating a checksum corresponding to packets in the datagram, and inserting the checksum into one of the plurality of null packets. Furthermore, an embodiment of the present invention provides for a method of identifying an error within a datagram, the method comprising the steps of receiving a datagram and a checksum corresponding to the datagram, utilizing the checksum to determine that the datagram contains the error, and replacing the one or more non-null packets within the datagram with one or more null packets.

BRIEF DESCRIPTION OF THE DRAWINGS

The present invention will be more readily understood from the detailed description of exemplary embodiments presented below considered in conjunction with the attached drawings, of which.

DETAILED DESCRIPTION OF THE DRAWINGS

The present invention relates to a method, system, and computer-readable medium for inserting a checksum into a null packet within a transport stream. According to certain embodiments of the present invention, a checksum inserter receives a transport stream comprising a plurality of packets. The checksum inserter groups the plurality of packets into one or more datagrams. A checksum is then generated corresponding to each datagram. Each of the generated checksums is inserted into a null packet within the transport stream, thereby creating a modified transport stream. According to certain embodiments of the present invention wherein the transport stream is encoded at a constant bit rate, null packets are included in the transport stream to maintain the given constant bit rate. A null packet carrying a checksum comprises the same number of bytes as a null packet not carrying a checksum. As a result, inserting a checksum into a null packet does not increase the bit rate of the transport stream. The checksum inserter then forwards the modified transport stream to its destination (i.e., a transport stream receiving module) within a communications network. The term "modified transport stream" is intended to include, but is not limited to, a transport stream wherein a checksum in located in at least one null packet.

In addition, the present invention relates to a method, system, and computer-readable medium for receiving a modified transport stream and performing integrity verification based on the checksum within the modified transport stream. The checksum may be utilized to determine if an error exists in a datagram within the modified transport stream. In instances wherein an error is present, embodiments of the present invention perform error nullification to remove any error from within the datagram.

Figure 1:
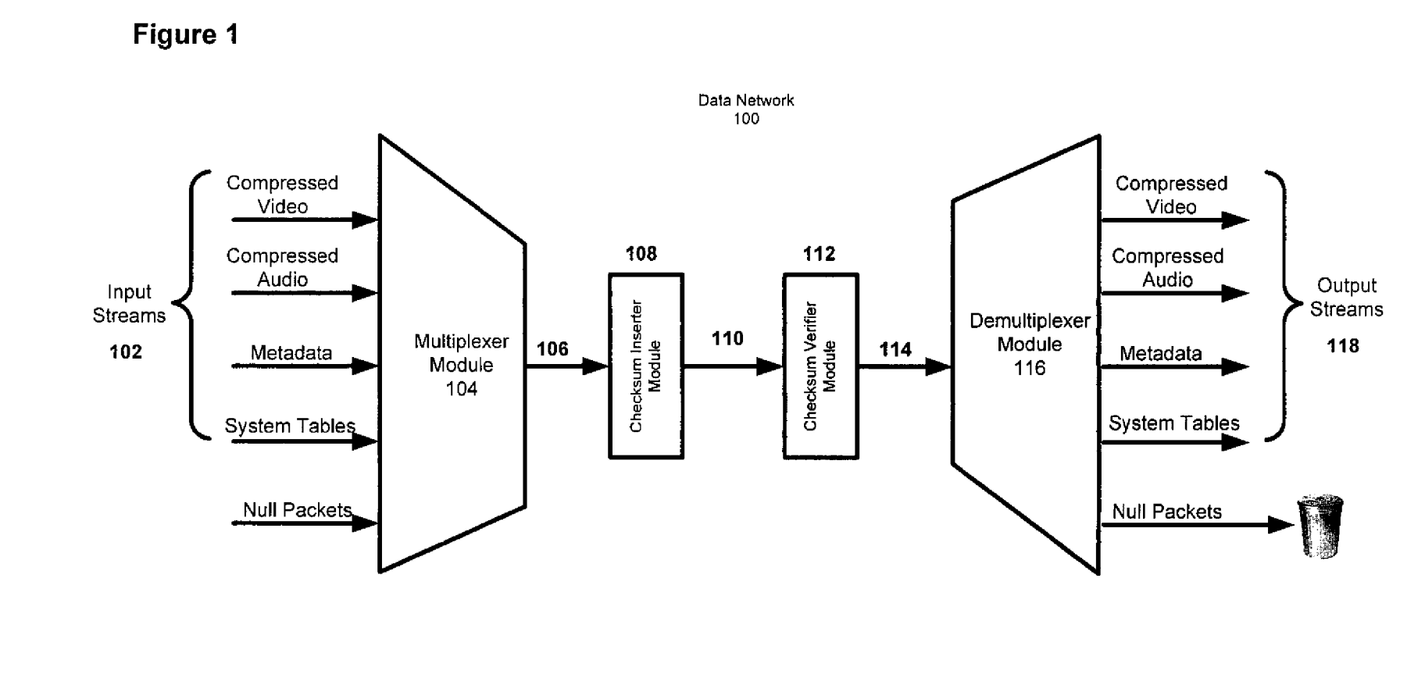
FIG. 1 illustrates an exemplary system for identifying an error within a transport stream, according to an embodiment of the present invention.

FIG. 1 illustrates a Data Network 100 according to an embodiment of the present invention. As illustrated in FIG. 1, the Data Network 100 may include Input Streams 102, a Multiplexer Module 104, a Transport Stream 106, a Checksum Inserter Module 108, a Modified Transport Stream 110, a Checksum Verifier Module 112, a Forwarded Transport Stream 114, a Demultiplexer Module 116, and Output Streams 118. As used herein, the term "module" is intended to include, but is not limited to, one or more computers configured to execute one or more software programs configured to perform one or more functions. The term "computer" is intended to include any data processing device, such as a desktop computer, a laptop computer, a mainframe computer, a personal digital assistant, a server, a handheld device, or any other device able to process data. The aforementioned components of the Data Network 100 represent computer-implemented hardware and software modules configured to perform the functions described in detail below. One having ordinary skill in the art will appreciate that the components of the Data Network 100 may be implemented on one or more communicatively connected computers. The term "communicatively connected" is intended to include, but is not limited to, any type of connection, whether wired or wireless, in which data may be communicated, including, for example, a connection between devices and/or programs within a single computer or between devices and/or programs on separate computers.

As illustrated in FIG. 1, the Multiplexer Module 104 receive is configured to receive the Input Streams 102, wherein the Input Streams 102 may include a plurality of individual input streams. According to the embodiment of the present invention illustrated in FIG. 1, the Input Streams 102 may include, individually or in combination, a compressed video input stream, a compressed audio input stream, a meta input stream, and a system tables input stream. In alternative embodiments of the present invention, the Input Streams 102 may include additional streams or fewer streams. The Input Streams 102 may represent digital content streaming over the Data Network 100. For example, the Input Streams 102 may represent an MPEG-2 video clip streaming over the Internet.

The Multiplexer Module 104 is configured to multiplex the Input Streams 102 into a Transport Stream 106. According to an embodiment of the present invention wherein the Transport Stream 106 is encoded at a constant bit rate, each input stream within the Input Streams 102 may be allotted a single fixed length packet during each transport packet period. In the event that a given input stream lacks data to occupy an allotted packet within a given transport packet period, the Multiplexer Module 104 may insert a null packet into the Transport Stream 106 to ensure that the constant bit rate is maintained. As a result, the Transport Stream 106 may include one or more null packets.

Following the creation of the Transport Stream 106, the Multiplexer Module 104 transmits the Transport Stream 106 to the Checksum Inserter Module 108. The Checksum Inserter Module 108 is configured to receive the Transport Stream 106 and create a datagram by grouping together a plurality of packets within the Transport Stream 106. The Checksum Inserter Module 108 then generates a checksum based on the datagram and inserts the checksum into a null packet within the Transport Stream 106, thereby creating a Modified Transport Stream 110. In an embodiment of the present invention, the Modified Transport Stream 110 represents a digital television signal that is transmitted over a communications network to a cable TV box at a customer's premise. The functionality of the Checksum Inserter Module 108 will be described in greater detail in reference to FIGS. 2 and 3.

According to the embodiment of the present invention illustrated in FIG. 1, the Checksum Verifier Module 112 receives the Modified Transport Stream 110. The Checksum Verifier Module 112 is configured to extract a checksum from within the Modified Transport Stream 110 and utilize the checksum to determine if an error exists within the corresponding datagram. An error may exist within the datagram as a result of a malfunction occurring during transmission of the transport stream or intentional manipulation of the transport stream. In the event that the Checksum Verifier Module 112 determines that an error is present within the datagram, the Checksum Verifier Module 112 will perform error nullification. Error nullification is a process of removing the packets associated with the corrupted datagram and replacing each packet with a null packet. Once the integrity of a datagram has been confirmed or error nullification has occurred, the Modified Transport Stream 110 is considered a Verified Transport Stream 114. The functionality of the Checksum Verifier Module 108 will be described in greater detail in reference to FIGS. 6 and 7.

The process of error nullification does not fix a detected error, however it removes the error from the Modified Transport Stream 110 and ensures Demultiplexer that the error is not included in the digital content rendered based on the Modified Transport Stream 110. For example, in an embodiment of the present invention implemented in an aerial surveillance system, substituting a plurality of null packets in the place of a datagram containing an error ensures that the error is not presented to an operator viewing the surveillance video. The operator may view an interruption in the surveillance video, as a result of the null packets, instead of a video containing an error. Therefore, the operator will not be misled by content generated as a result of an error.

Following the creation of the Verified Transport Stream 114, the Checksum Verifier Module 108 transmits the Verified Transport Stream 114 to the Demultiplexer Module 116. The Demultiplexer Module 116 demultiplexes the Verified Transport Stream 114 and creates the Output Streams 118. As illustrated in FIG. 1, the Output Streams 118 may include, individually or in combination, a compressed video stream, a compressed audio stream, a metadata stream, and a system tables stream. One or more of the Output Streams 118 may be utilized to render digital content such as an MPEG-2 Video File. Given that the checksum has already been utilized, the null packets within the Verified Transport Stream 114 no longer contain any useful information and, as a result, the Demultiplexer Module 116 discards the null packets.

Figure 2:
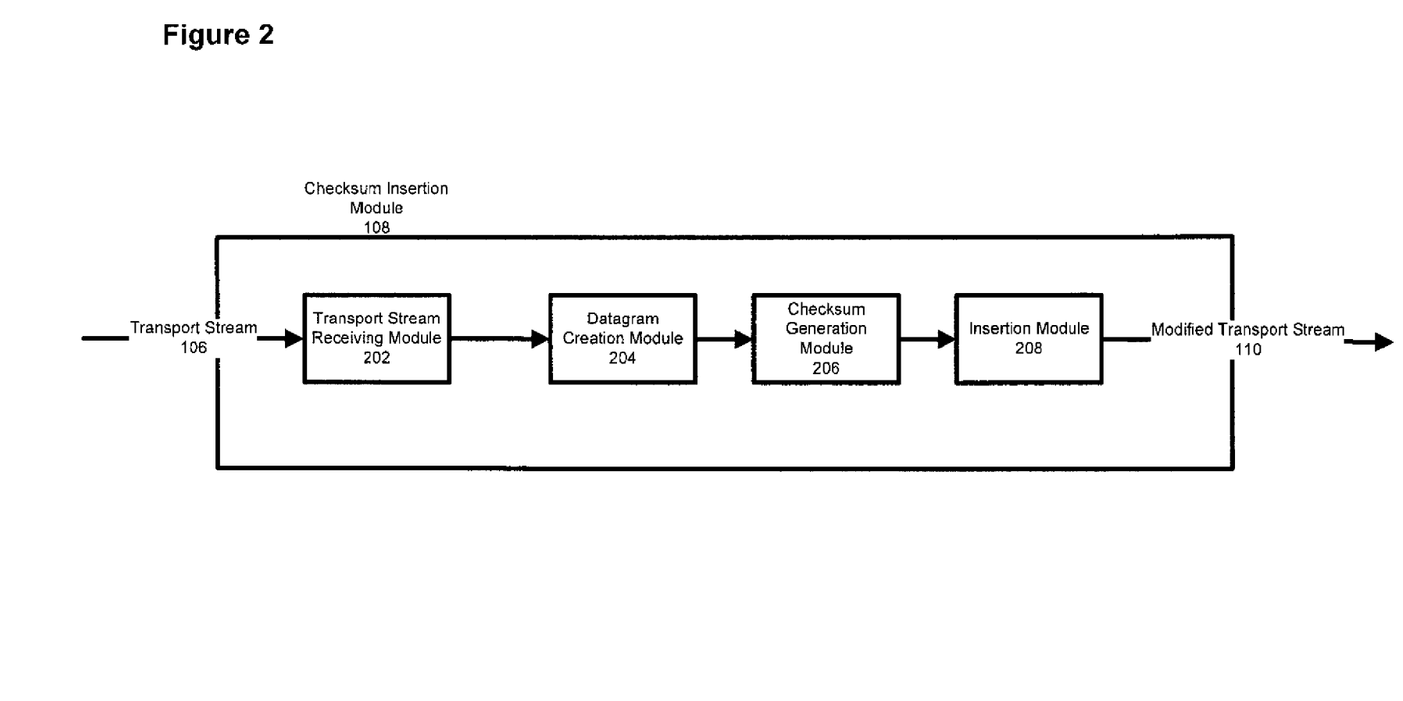
FIG. 2 illustrates an exemplary system for inserting a checksum into a transport stream, according to an embodiment of the present invention.

As illustrated in FIG. 2, the Checksum Inserter Module 108 comprises a Transport Stream Receiving Module 202, a Datagram Creation Module 204, a Checksum Generation Module 206, and an Insertion Module 208. The features and functionality of embodiments of the Checksum Inserter Module 108 and its components are described in detail in connection with the system diagram of FIG. 2 and the process flow diagram of FIG. 3.

Figure 3:
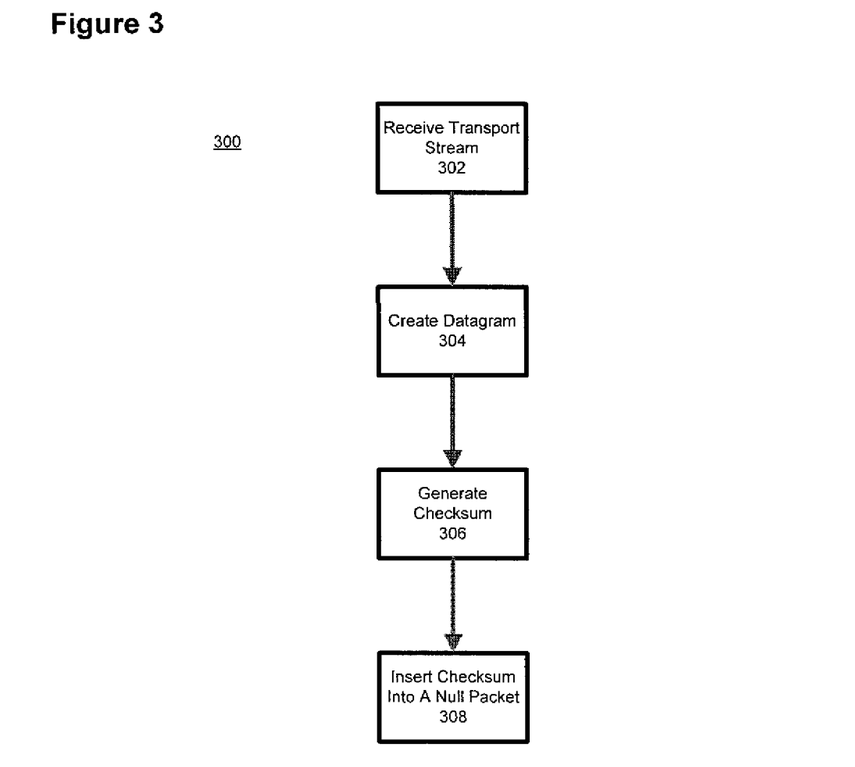
FIG. 3 illustrates an exemplary method for inserting a checksum into a transport stream, according to an embodiment of the present invention.

As illustrated in FIG. 2, the Checksum Insertion Module 108 includes a Transport Stream Receiving Module 202 configured to receive a Transport Stream 106, in step 302 of FIG. 3. As described above, the Transport Stream 106 comprises a plurality of packets wherein one or more of the packets may be a null packet. For example, the Transport Stream 106 may comprise a series of one hundred packets, of which three null packets may be located within the series of packets. The remaining packets are non-null packets (i.e., packets not inserted into a transport stream for the sole reason of maintaining a constant bit rate).

Figure 4A:
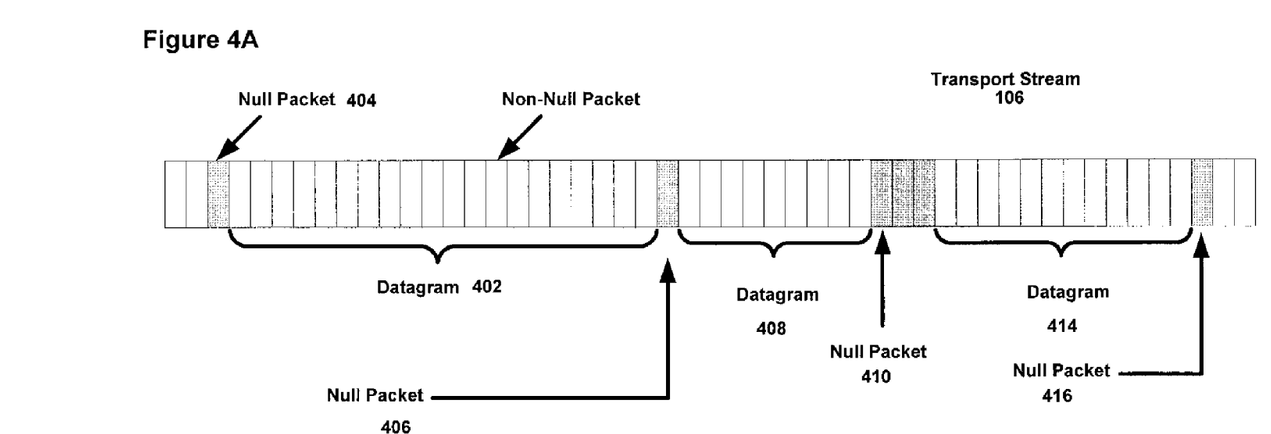
FIG. 4A illustrates a transport stream, prior to processing by systems and methods according to embodiments of the present invention.

Following the receipt of the Transport Stream 106 by the Transport Stream Receiving Module 202, the Transport Stream 106 is forwarded to the Datagram Creation Module 204. The Datagram Creation Module 204 is configured to create one or more datagrams based on the packets within the Transport Stream 106, in step 304 of FIG. 3. The Datagram Creation Module 204 defines a datagram by grouping together a plurality of non-null packets from within the Transport Stream 106. As illustrated in FIG. 4A, the Transport Stream 106 comprises a plurality of packets including both null packets and non-null packets. According to an embodiment of the present invention, the Datagram Creation Module 204 defines three datagrams based on the three groups of non-null packets located between the null packets. For example, the Datagram Creation Module 204 creates a Datagram 402 by appending together the bytes associated with the twenty non-null packets located between a Null Packet 404 and a Null Packet 406. Assuming the Transport Stream 106 comprises transport packets with a fixed length of 188 bytes per packet, the Datagram 402 is represented by the 3760 bytes included in the twenty non-null packets located between the Null Packet 404 and the Null Packet 406. The Datagram Creation Module 204 then groups the next nine non-null packets (located between the Null Packet 406 and a Null Packet 410) into a Datagram 408, and the subsequent twelve non-null packets (located between a Null Packet 412 and a Null Packet 416) into a Datagram 414.

When grouping a plurality of packets into a datagram, embodiments of the present invention may utilize the first non-null packet following a null packet to identify the start of a new datagram and the subsequent null packet to indicate the end of the datagram. As a transport stream arrives, the Datagram Creation Module 204 identified a null packet and stores the following non-null packets in a buffer until the next null packet arrives, signify the end of the datagram. As such, all of the non-null packets places in the buffer will be grouped by the Datagram Creation Module 204 to form a datagram.

In an alternative embodiment of the present invention wherein the number incoming non-null packets exceeds the capacity of the buffer, a checksum may be created based on less than all of the packets that arrive between a null packet and the following null packet. As a result, the checksum may be generated corresponding to only a portion of the datagram. Limiting a checksum to only a portion of a datagram restricts the ability of the Checksum Verifier Module 116 to verify integrity of the entire datagram. In an embodiment of the present invention wherein a checksum has been created based on only a portion of a datagram, the Checksum Verifier Module 116 can be notified of the length of the shortened datagram, using, for instance, special version field codes.

Following the creation of a datagram, the Checksum Generation Module 206, at step 306, generates a corresponding checksum. Each checksum created by the Checksum Generation Module 206 corresponds to a given datagram and can be used to determine if an error is present within the datagram. Returning to the example above wherein the Datagram 402 included 3760 bytes, a checksum generated based on the Datagram 402 may be used to verify the integrity of the 3760 bytes within the Datagram 402. The checksum identifies whether an error is present in a particular datagram but does not identify the location of the error within the datagram or provide forward error correction information to correct the error. When creating the checksum, the Checksum Generation Module 206 may implement any suitable checksum format, such as, for example, Accumulated Sum, C-Byte Cyclic Redundancy Check, Secure Hash Algorithm, Message Digest Algorithm, or Message Digest Algorithm 5. In addition, the Checksum Generation Module 206 may encrypt the checksum to increase security when transmitting the checksum. The checksum could be encrypted through the use of a private key/public key pair, wherein the public key is inserted into the null packet along with the encrypted checksum and transmitted to the destination node. In an alternative embodiment, symmetric key encryption may be implemented wherein the symmetric key is transmitted to the destination node through an out-of-band transmission channel.

Following the generation of the checksum by the Checksum Generation Module 204, the Modified Transport Stream 110 is created by the Insertion Module 208, at step 308. The Insertion Module 208 creates the Modified Transport Stream 110 by inserting a checksum into a null packet. Given that a checksum does not increase the size of the null packet, using the null packet to carry a checksum does not increase the bit rate of the transport stream. As a result, the bit rate of the Transport Stream 106 equals the bit rate of the Modified Transport Stream 110.

Figure 4B:
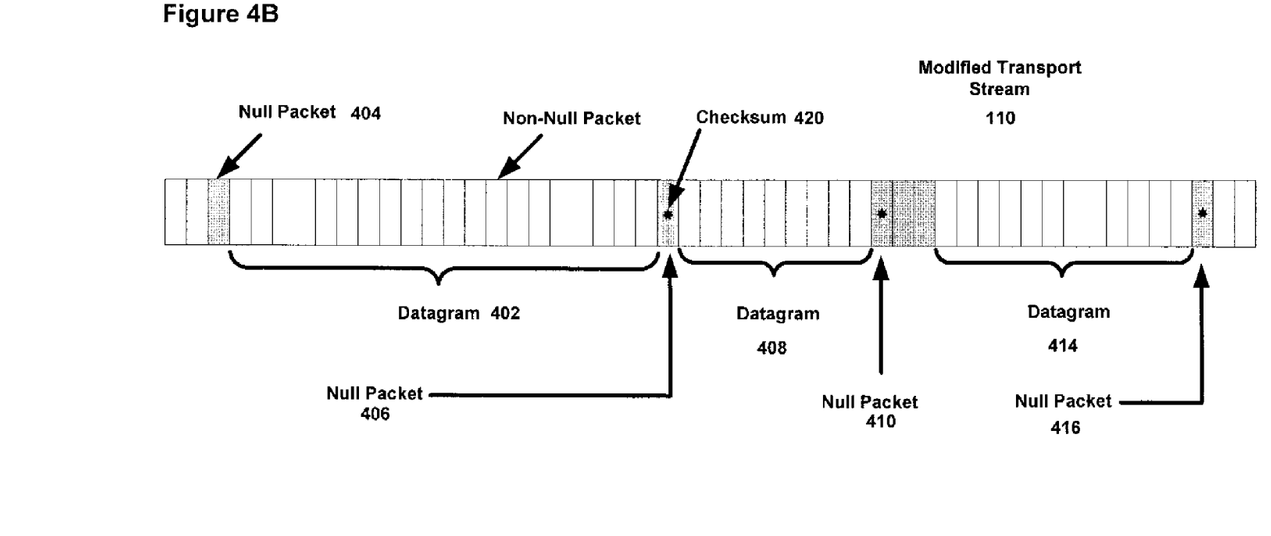
FIG. 4B illustrates a modified transport stream, according to an embodiment of the present invention.

FIG. 4B illustrates the Modified Transport Stream 110 wherein a checksum as been inserted into the first null packet following the corresponding datagram. In FIG. 4B, a Checksum 420 corresponds to the Datagram 402 and is inserted into the Null Packet 408. As a result, the Checksum 420 is located in the first null packet following the Datagram 402. Following this processing, the Modified Transport Stream 110 comprises a Checksum 422 corresponding to the Datagram 408 and a Checksum 424 corresponding to the Datagram 414, wherein both checksums are nested in the null packets following their corresponding datagram. In alterative embodiments of the present invention, a checksum could be inserted in a null packet other than the null packet immediately following the corresponding datagram.

In an embodiment of the present invention wherein more than one null packet follows a given datagram, the same checksum may be inserted in each or any of the null packets following a given datagram. Alternatively, a different checksum may be generated for each null packet following the datagram, wherein the datagram upon which the checksum is based may include one or more of the null packets. For example, if a datagram is followed by three null packets, the checksum generated and inserted into the third null packet may correspond to the datagram as well as the two subsequent null packets.

Figure 5:
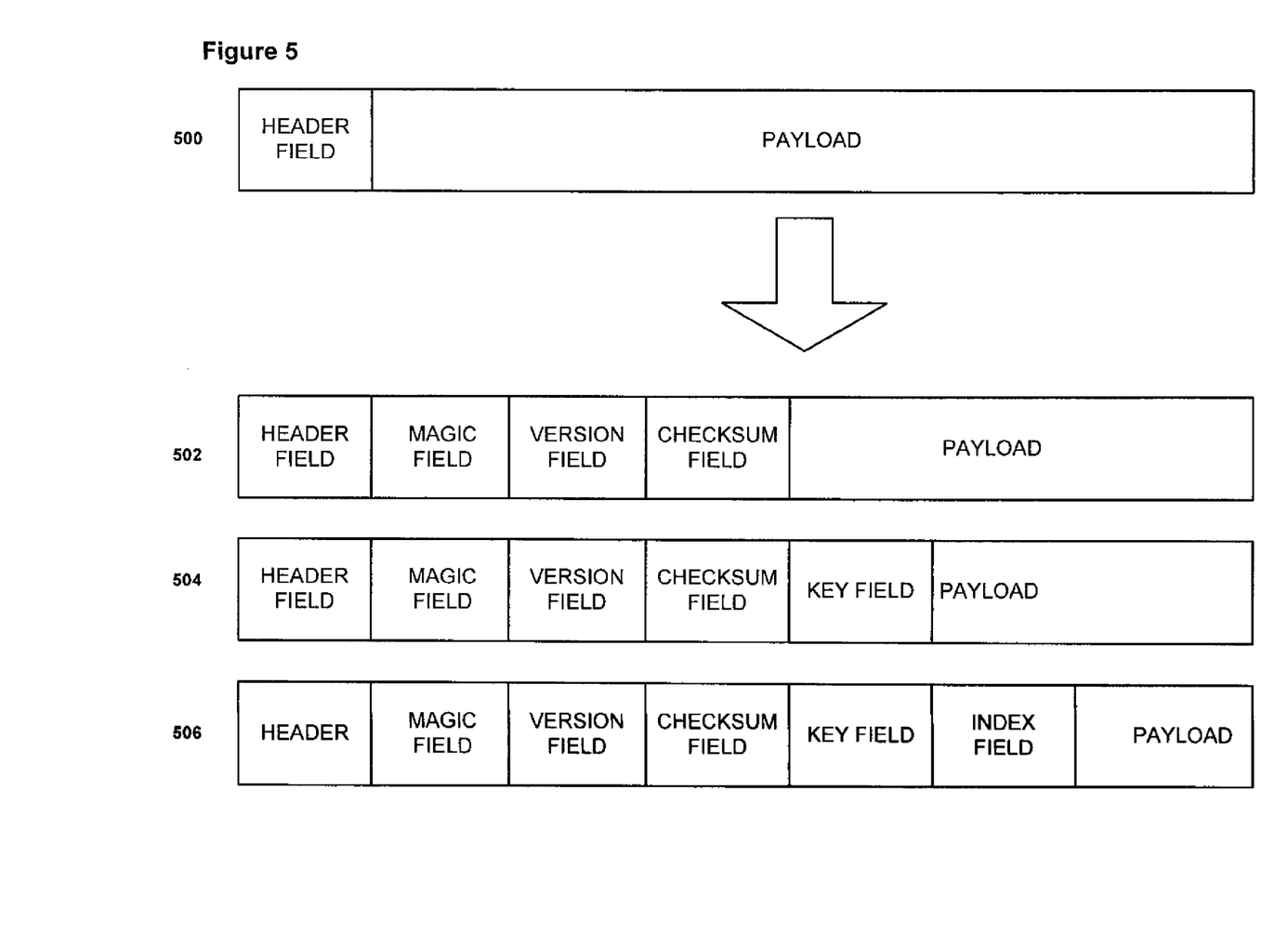
FIG. 5 illustrates a plurality of null packet formats that may be utilized to carry a checksum, according to certain embodiments of the present invention.

FIG. 5 provides a more detailed illustration of a null packet, as well as alternative embodiments of null packets carrying a checksum. In FIG. 5, a First Null Packet 500 represents a null packet prior to insertion of a checksum. The First Null Packet 500 includes only a header field and a payload. The header field contains a Packet ID (PID) that identifies the packet as a null packet. The payload portion of the null packet carries no substantive data and acts only to fulfill the requirements of a given fixed bit rate protocol.

In an embodiment of the present invention wherein a legacy node receives the Modified Transport Stream 110, the legacy node may utilize the header field within the null packet to identify the packet as a null packet. Given that legacy nodes are generally configured to discard all null packets, the receipt of a null packet altered to carry a checksum does not cause the receiving node to error or malfunction. The legacy node simply discards the null packet without addressing the checksum. As a result, embodiments of the present invention can be implemented within networks including both legacy nodes, nodes configured to receive modified transport streams, or a combination of the two node types.

The Second Null Packet 502 illustrates a null packet carrying a checksum. According to an embodiment of the present invention, the Second Null Packet 502 includes a header field, a magic field, a version field, a checksum, and a payload. The header field identifies the Second Null Packet 502 as a null packet. The Second Null Packet also includes a magic field that carries a magic word. A magic word is a combination of characters inserted into a null packet to inform a receiving node that the corresponding null packet contains a checksum. The receiving node positively identifies null packets carrying checksums through use of the magic word. Embodiments of the present invention select a magic word that offers high immunity to emulation by a random null packet payload. For instance, a magic word may be three characters long, such as 'C', 'H', 'K' in ASCII (0x43, 0x48, 0x4B in hexadecimal). According to an embodiment of the present invention, once a receiving node has identified a packet as a null packet by examining the header field, the receiving node determines if the magic word is "CHK," or any other magic word selected to identify a null packet carrying a checksum. If the magic work is "CHK", the receiving node performs integrity verification based on the checksum embedded in the null packet.

The Second Null Packet 502 also includes a version field that identifies the version or protocol of the checksum used. The checksum follows the version field within the Second Null Packet 502. Given that a public key is not transmitted within the Second Null Packet 502 the checksum within this null packet could either be unencrypted or encrypted using symmetric key encryption. The remaining bytes carry no substantive data and act only to fulfill the requirements of the given fixed bit rate protocol. According to the exemplary embodiment of the present invention illustrated in FIG. 5, a Third Null Packet 504 may be included in the Modified Transport Stream 110 which is similar to the Second Null Packet 502 however the checksum within the Third Null Packet 504 has been encrypted using a public key/private key pair and the public key is transmitted within the key field.

In certain embodiments of the present invention, such as the transmission of an MPEG-2 transport stream over an IP network, it may be desirable to know whether packets have arrived out of order, have been delayed or have been dropped. If the Real Time Protocol (RTP) layer is used, the RTP Sequence Number can be used to detect these conditions and, in some cases, be used to re-order the packets. However, if the RTP layer is not used, embodiments of the present invention may utilize an index field within the null packet to account for packets arriving out of order, being delayed or being dropped.

In one embodiment of the present invention, an index value is inserted in the index field, as illustrated in a Fourth Null Packet 506. The index value reflects the number of packets included in a transport stream at a given point within the transport stream. The index value may be formatted, for example, as an unsigned 8-byte integer in big-endian format. When the Checksum Generation Module 206 is initialized, the first index value can either be zero or some other value.

The Checksum Generation Module 206 updates the index value based on the number of packets transmitted within the transport stream. When the Checksum Verifier Module 112 is initialized, it resets its packet counter to the value of the first received index value and compares the received index value with a count of received packets. If the Checksum Verifier Module 112 confirms each received index value, the Checksum Verifier Module 112 establishes a high degree of confidence that no packets were dropped or added during transmission. If the index values are not confirmed, the Checksum Verifier Module 112 determines that packet loss or addition has occurred within the transport stream. To prevent spoofing, the index value may itself be encrypted/decrypted with the same keys used to encrypt/decrypt the checksum value.

In an alternative embodiment of the present invention, the size of a datagram (in either bytes or packets) may be used as the index value and inserted in the index field. The datagram size can be formatted, for example, as an unsigned 8-byte integer in big-endian format. As a result, the Checksum Verifier Module 112 may utilize the index value to verify the number of packets within each datagram. If an individual index value associated with a particular datagram is not confirmed, the Checksum Verifier Module 112 determines that packet loss has occurred within the particular datagram.

As illustrated in FIG. 5, a portion of the null packets 502-506 remains unutilized. To capitalize on this unused bandwidth, certain embodiments of the present invention transmit more than one checksum within a single null packet. According to certain embodiments of the present invention, a separate checksum may be generated for each data type present in a datagram or transport stream. For example, a checksum may be generated corresponding to only the video packets within a datagram or only the audio packets within the datagram. Advantageously, separate checksums allow error detection for a particular data type (e.g., video, audio, etc). These separate checksums may be inserted within the remaining payload portion of a null packet. Alternatively, in an embodiment of the present invention wherein the integrity of a single data type is the primary concern, the checksum corresponding to the specific data type may be inserted as the only checksum within a given null packet.

In an alternative embodiment of the present invention, the unutilized portion of a null packet may be used to carry a second checksum, wherein the second checksum corresponds to the datagram following the null packet. As a result, the null packet may contain a first checksum corresponding to the datagram before the null packet and a second checksum corresponding to the datagram after the null packet.

The null packets 502-506 illustrated in FIG. 5 reflect instances where the checksum does not fill the entire null packet payload. However, in certain embodiments of the present invention, null packets may be spaced so far apart that the size of a datagram may become exceedingly large. As a result, the checksum corresponding to a datagram may exceed the payload capacity of a single null packet. In such an instance, the datagram may be split into smaller datagrams by replacing selected Program Association Table (PAT) and/or Program Map Table (PMT) Packets with null packets. PAT and PMT packets are utilized by certain protocols, such as MPEG-2, but the information contained within these packets is highly redundant and the insertion rate of these packets is not strictly specified or enforced. Since the data in these packets is redundant, replacing a PAT or PMT packet with a dull packet does not, in general, disrupt demultiplexer timing and does not, in general, degrade any of the supplied signaling information. If a PAT or PMT packet is replaced, the continuity counters of subsequent PAT or PMT packets may be adjusted by the Checksum Verifier Module 112 to ensure compliance with protocol specifications.

Figure 6:
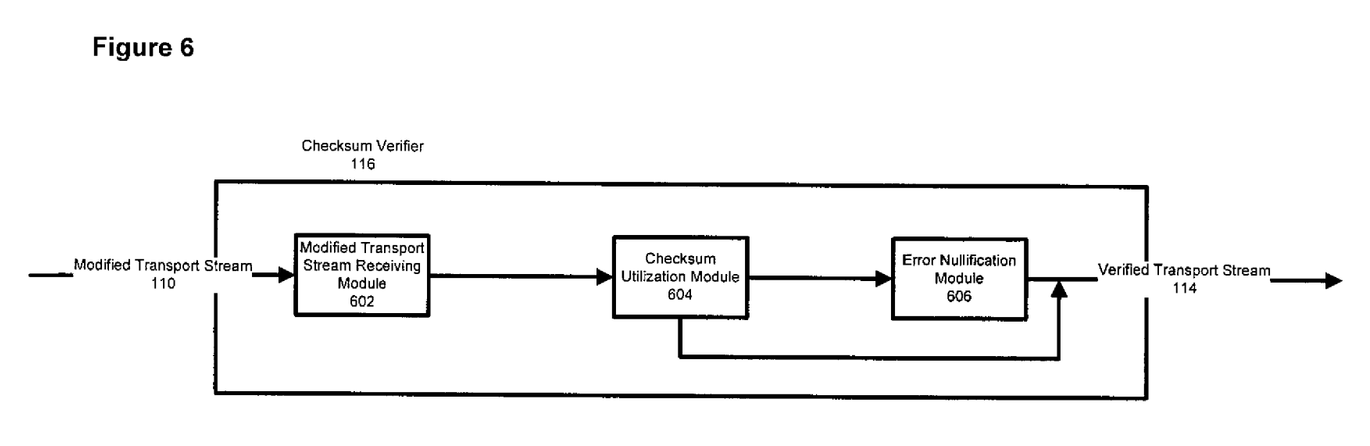
FIG. 6 illustrates an exemplary system for performing checksum verification, according to an embodiment of the present invention.

According to certain embodiments of the present invention, a Checksum Verification Module 112 may be utilized to receive the Modified Transport Stream 110 and perform error detection. As illustrated in FIG. 6, the Checksum Verifier Module 116 may comprise a Modified Transport Stream Receiving Module 602, a Checksum Utilization Module 604, and an Error Nullification Module 606. The features and functionality of embodiments of the Checksum Verifier Module 116 and its components are described in detail in connection with the system diagram of FIG. 6 and the process flow diagram of FIG. 7.

Figure 7:
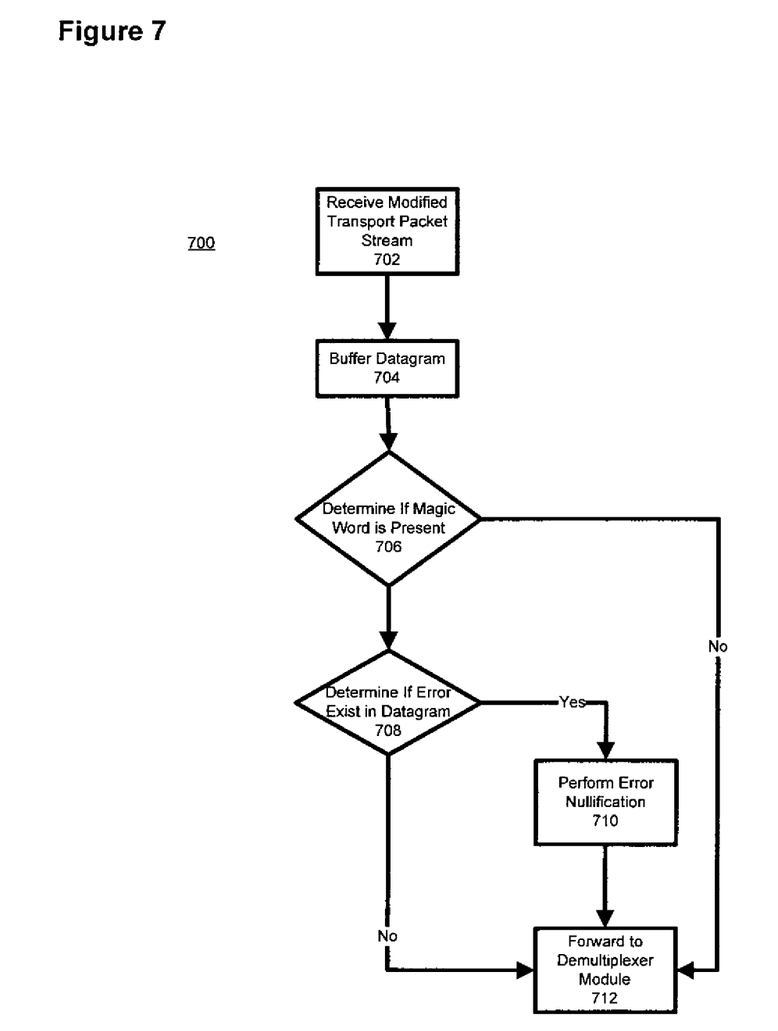
FIG. 7 illustrates an exemplary method for performing checksum verification, according to an embodiment of the present invention.

As illustrated in FIG. 6, the Checksum Verifier Module 116 includes the Modified Transport Stream Receiving Module 602 configured to receive a Modified Transport Stream 110, in step 702 of FIG. 7. Following the receipt of the Modified Transport Stream 110, the Modified Transport Stream 110 is processed by the Checksum Utilization Module 604, at steps 704-710. The Checksum Utilization Module 604 is configured to utilize a checksum stored within a null packet to determine if an error is present within the corresponding datagram.

According to an embodiment of the present invention, the Checksum Utilization Module 604 buffers the first datagram within the Modified Transport Stream 110, at step 704. Process 700 continues at step 706 wherein the Checksum Utilization Module 604 inspects the first null packet following the buffered datagram. The packet following the buffered datagram may be identified as a null packet by examining the packet header. The Checksum Utilization Module 604 then determines if a magic word is present. As described above, the presence of a magic word confirms that the null packet is carrying a checksum. In the event that a magic word is not found, the null packet and the datagram are passed to the Demultiplexer Module 116, at step 712, as part of a Verified Transport Stream 114.

Following the detection of a magic word, the Checksum Utilization Module 604 performs checksum verification by utilizing the checksum within the first null packet to determine if an error exists within the buffered datagram, at step 710. If the checksum within the null packet is encrypted, the checksum is decrypted prior to performing checksum verification. The Checksum Utilization Module 604 first creates a new checksum based on the buffered datagram. The Checksum Utilization Module 604 compares the new checksum with the checksum from the null packet. If the checksums are identical, the checksum from the null packet is considered a "good checksum" and the Checksum Utilization Module 604 confirms that no errors exist in the datagram. As a result, the datagram (including any following null packets) is forwarded to the Demultiplexer Module 116, at step 712. However, in the event that the new checksum is not identical to the checksum from the null packet, the checksum is considered a bad checksum. A bad checksum is indicative of an error within the datagram (i.e., a corrupted datagram).

Figure 8:
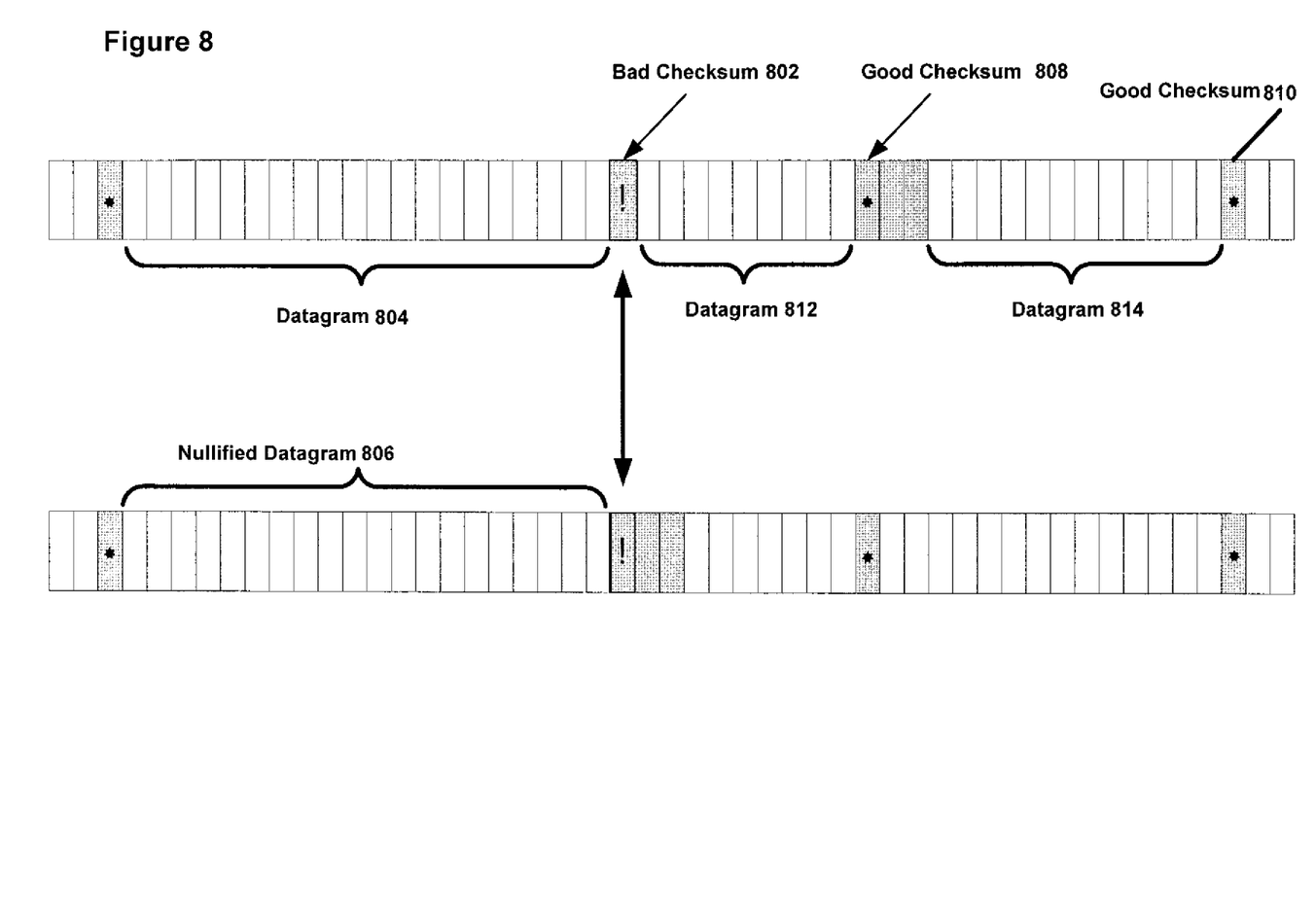
FIG. 8 illustrates an exemplary method for modifying a transport stream, according to an embodiment of the present invention.

In order to avoid propagation of an error within the corrupted datagram, the Error Nullification Module 606 performs error nullification on the affected datagram, at step 710. As illustrated in FIG. 8, error nullification replaces all of the packets within a corrupted datagram with null packets. This provides the proper number of packets to preserve the original timing required to demultiplex the transport stream but removes the error from within the transport stream.

As illustrated in FIG. 8, checksum verification may identify a Checksum 802 as a bad checksum, thereby demonstrating that a Datagram 804 contains an error. The exact location of the error within the Datagram 804 can not be determined through use of checksum verification, only the fact that the received Datagram 804 is not identical to the transmitted datagram. Given that the location of the error is unknown, all packets within the Datagram 804 are removed and substituted with null packets, thereby producing a Nullified Datagram 806. The Nullified Datagram 806, including any subsequent null packets, are then forwarded to the Demultiplexer Module 116, at step 712, as part of the Verified Transport Stream 114. Given that the Checksums 808 and 810 are good checksums, no error nullification is performed on the related datagrams 812 or 814.

According to certain embodiments of the present invention, the index field may be used to provide additional error detection. In such an embodiment, error nullification may be performed in the event that the Checksum Utilization Module 604 detects an error based on the information contained within the index field.

According to the embodiment of the present invention illustrates in FIGS. 6 and 7, having confirmed that a datagram is error free, the Verified Transport Stream 114 is forwarded to the Demultiplexer Module 116. As described above, the Demultiplexer Module 116 demultiplexes the Verified Transport Stream 114 and creates the Output Streams 118. The digital content rendered based on the Output Streams 118 may include interruptions where error nullification has occurred, however the digital content does not include erroneous information stemming from an error inserted into a transport stream during transmission. According to certain embodiments of the present invention, the Checksum Inserter Module 108, or one or more of the components therein, may be integrated into the Demultiplexer Module 116.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

The invention claimed is:

1. A non-transitory computer-implemented method of inserting a checksum into a transport stream including a plurality of null packets and a plurality of non-null packets, the method comprising:
grouping the plurality of non-null packets within the transport stream into a datagram;
generating a checksum corresponding to the datagram; and
inserting the checksum into one of the plurality of null packets, thereby creating a modified transport stream.

2. The method of claim 1, wherein the modified transport stream comprises a first null packet and a second null packet separated by the datagram.

3. The method of claim 2, wherein inserting the checksum into one of the plurality of null packets comprises inserting the checksum into the second null packet.

4. A non-transitory computer-implemented method for identifying an error within a datagram, comprising:
receiving a transport stream comprising:
a datagram comprising one or more non-null packets, and
a checksum corresponding to the datagram;
utilizing the checksum to determine that the datagram contains the error; and
replacing the one or more non-null packets of the datagram with one or more null packets.

5. The method of claim 4, wherein the transport stream comprises a first null packet and a second null packet separated by the datagram.

6. A non-transitory computer-readable medium having computer executable software code stored thereon for inserting a checksum into a transport stream including a plurality of null packets and a plurality of non-null packets, the computer-readable medium comprising:
code for grouping the plurality of non-null packets within the transport stream into a datagram executed on the computer;
code for generating a checksum corresponding to the datagram; and
code for inserting the checksum into one of the plurality of null packets, thereby creating a modified transport stream.

7. The computer-readable medium of claim 6, wherein the modified transport stream comprises a first null packet and a second null packet separated by the datagram.

8. The computer-readable medium of claim 7, wherein the code to insert the checksum into one of the plurality of null packets comprises inserting the checksum into the second null packet.

9. A non-transitory computer-readable medium having stored thereon computer executable software code for identifying an error within a datagram, the computer-readable medium comprising:
code for receiving a transport stream executed on a computer comprising:
a datagram comprising one or more non-null packets, and
a checksum corresponding to the datagram;
code for utilizing the checksum to determine that the datagram contains the error; and
code for replacing the one or more non-null packets of the datagram with one or more null packets.

10. The computer-readable medium of claim 9, wherein the transport stream comprises a first null packet and a second null packet separated by the datagram.

11. A system for inserting a checksum into a transport stream including a plurality of null packets and a plurality of non-null packets, comprising a non-transitory computer readable medium storing executable instructions thereon operable to execute, on a processor:
a datagram creation module, executed on a computer, configured to group the plurality of non-null packets within the transport stream into a datagram;
a checksum generation module configured to generate a checksum corresponding to the datagram; and
a checksum insertion module configured to insert the checksum into one of the plurality of null packets, thereby creating a modified transport stream.

12. The system of claim 11, wherein the modified transport stream comprises a first null packet and a second null packet separated by the datagram.

13. The system of claim 12, wherein the checksum insertion module inserts the checksum into the second null packet.

14. A system for identifying an error within a datagram, comprising a non-transitory computer readable medium storing executable instructions thereon operable to execute, on a processor:
a receiving module configured to receive a transport stream, using a computer, comprising;
a datagram comprising one or more non-null packets, and
a checksum corresponding to the datagram;
a checksum utilization module configured to utilize the checksum to determine that the datagram contains the error; and
an error nullification module configured to replace the one or more non-null packets of the datagram with one or more null packets.

15. The system of claim 14, wherein the receiving module is configured to receive the transport stream comprising a first null packet and a second null packet separated by the datagram.

* * * * *